US012356864B2

(12) United States Patent
Smeys et al.

(10) Patent No.: US 12,356,864 B2
(45) Date of Patent: Jul. 8, 2025

(54) ACOUSTIC ISOLATOR

(71) Applicant: TEXAS INSTRUMENTS INCORPORATED, Dallas, TX (US)

(72) Inventors: Peter Smeys, San Jose, CA (US); Mohammad Hadi Motieian Najar, Santa Clara, CA (US); Ting-Ta Yen, San Jose, CA (US); Ahmad Bahai, Lafayette, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1394 days.

(21) Appl. No.: 16/233,350

(22) Filed: Dec. 27, 2018

(65) Prior Publication Data
US 2019/0229254 A1   Jul. 25, 2019

Related U.S. Application Data

(60) Provisional application No. 62/620,825, filed on Jan. 23, 2018.

(51) Int. Cl.
*H10N 30/88* (2023.01)
*H04R 1/40* (2006.01)
(Continued)

(52) U.S. Cl.
CPC .......... *H10N 30/883* (2023.02); *H04R 1/403* (2013.01); *H04R 17/00* (2013.01); *H10N 30/20* (2023.02);
(Continued)

(58) Field of Classification Search
CPC . H01L 41/0533; H01L 41/0472; H01L 41/09; H01L 41/113; H01L 41/0477; H01L 41/18; G10K 11/02; G10K 11/16; G10K 11/162; G10K 11/24; H04R 1/403; H04R 17/00; H04R 17/02; H04R 31/00; H10N 30/883; H10N 30/872; H10N 30/20; H10N 30/30; H10N 30/877; H10N 30/85
See application file for complete search history.

(56) References Cited

U.S. PATENT DOCUMENTS

2007/0086274 A1* 4/2007 Nishimura ............. H04L 27/18
367/137
2007/0171002 A1* 7/2007 Unkrich ................. H03H 9/587
333/189

(Continued)

FOREIGN PATENT DOCUMENTS

WO   2007047701 A2   4/2007

OTHER PUBLICATIONS

Chinese Office Action dated Mar. 26, 2021.

*Primary Examiner* — Brigitte A Paterson
(74) *Attorney, Agent, or Firm* — Frank D. Cimino

(57) ABSTRACT

In one example, a semiconductor device includes an acoustic medium, a first transducer on the acoustic medium, a first electrode coupled to the first transducer, a second transducer on the acoustic medium, and a second electrode coupled to the second acoustic transducer. The semiconductor device also includes a semiconductor substrate to support the acoustic medium and first and second transducers. Mold compound encapsulates at least a portion of the acoustic medium, the first acoustic transducer, the second acoustic transducer, and the semiconductor substrate.

17 Claims, 5 Drawing Sheets

(51) Int. Cl.
  *H04R 17/00* (2006.01)
  *H04R 17/02* (2006.01)
  *H04R 31/00* (2006.01)
  *H10N 30/20* (2023.01)
  *H10N 30/30* (2023.01)
  *H10N 30/85* (2023.01)
  *H10N 30/87* (2023.01)
  *H10N 39/00* (2023.01)

(52) U.S. Cl.
  CPC ........... *H10N 30/30* (2023.02); *H10N 30/872* (2023.02); *H10N 39/00* (2023.02); *H04R 17/02* (2013.01); *H04R 31/00* (2013.01); *H10N 30/85* (2023.02); *H10N 30/877* (2023.02)

(56) References Cited

U.S. PATENT DOCUMENTS

| | | | |
|---|---|---|---|
| 2007/0188053 A1* | 8/2007 | Stark | B60C 23/041 310/339 |
| 2012/0218056 A1* | 8/2012 | Burak | H03H 9/58 333/191 |
| 2018/0027077 A1* | 1/2018 | Melodia | G16H 40/67 370/254 |

* cited by examiner

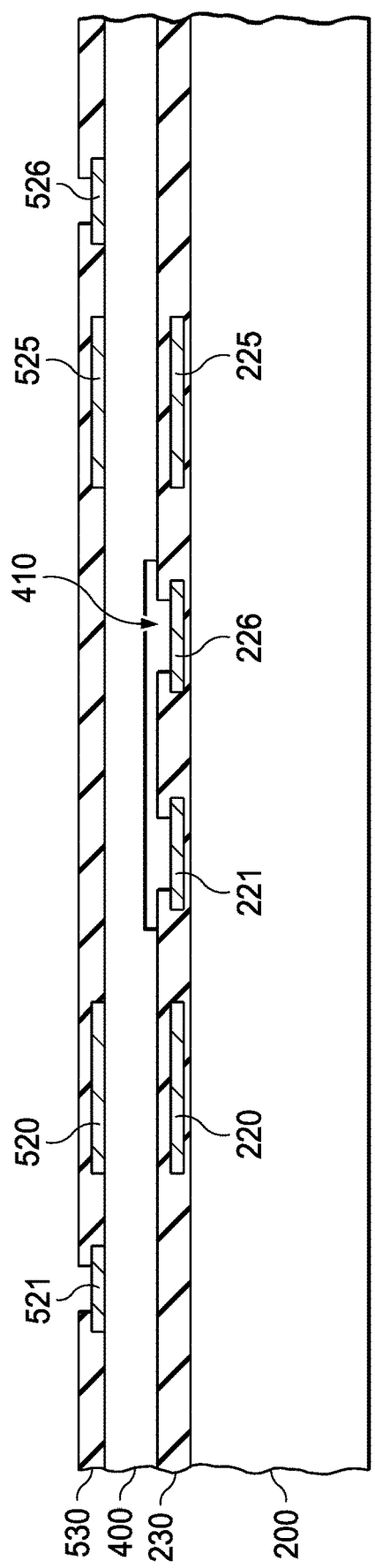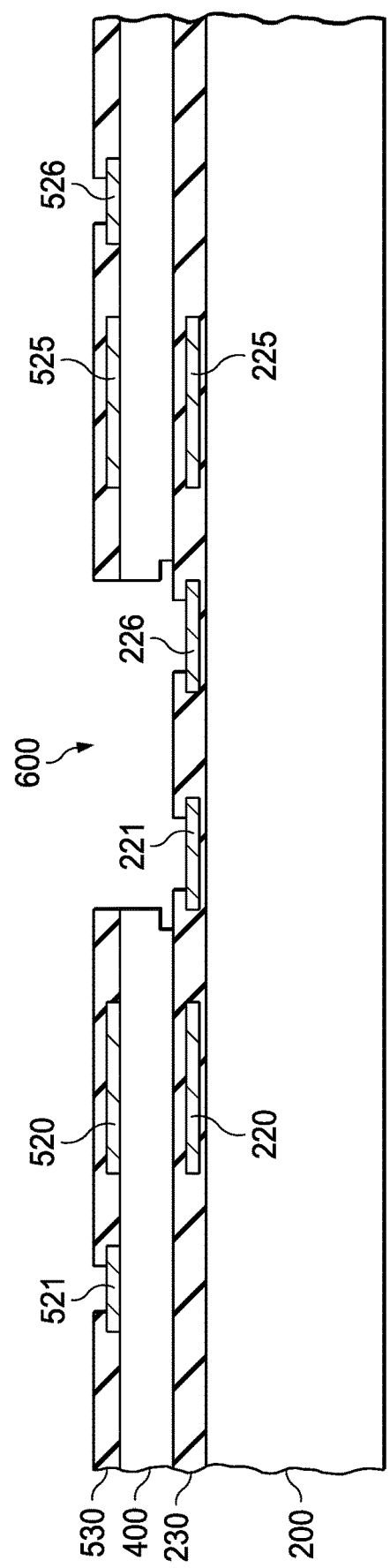
FIG. 5
FIG. 6

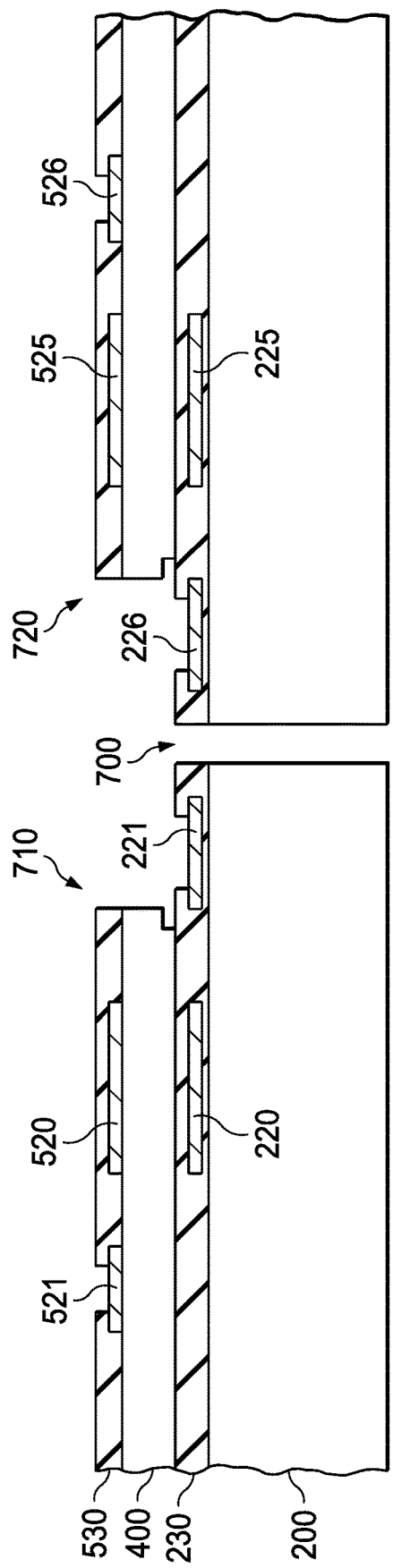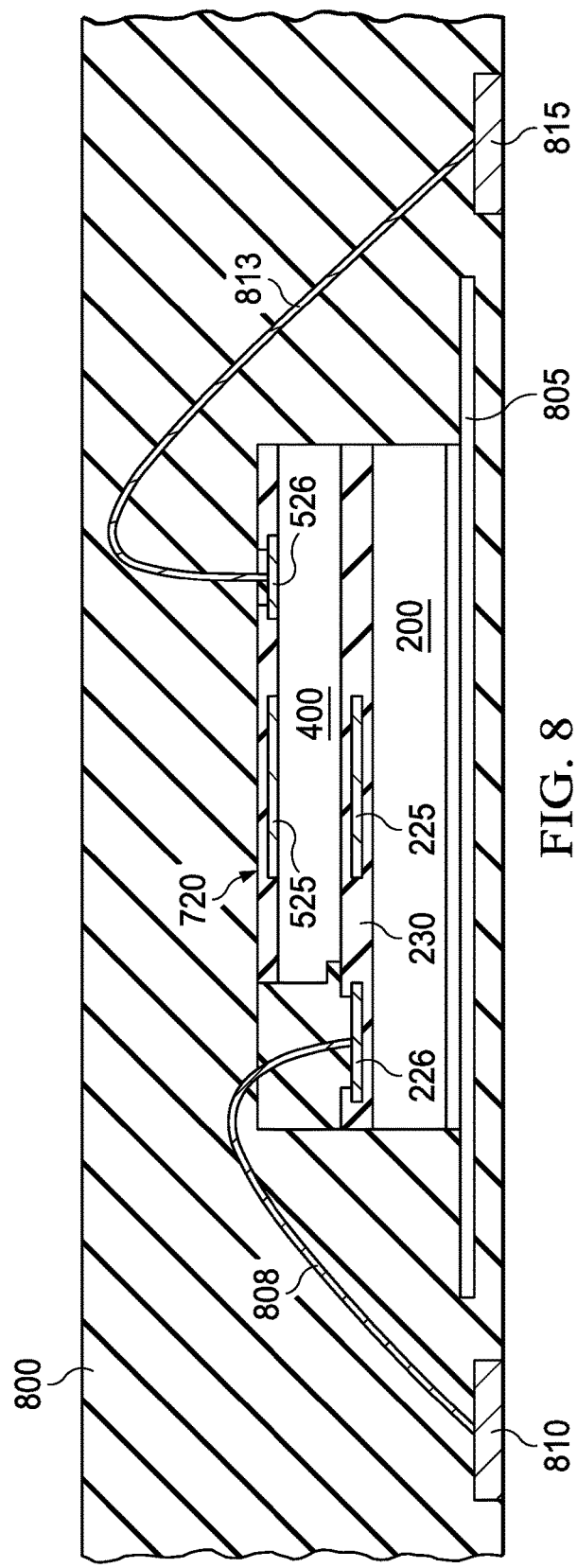

ACOUSTIC ISOLATOR

CROSS-REFERENCE TO RELATED APPLICATIONS

This application claims priority to U.S. Provisional Patent Application No. 62/620,825, filed Jan. 23, 2018, entitled "Acoustic Isolator," which is hereby incorporated herein by reference in its entirety.

BACKGROUND

Many circuits include devices that electrically isolate one part of the circuit from another part of the circuit. An example includes an optocoupler. An optocoupler includes a light source (e.g., a light emitting diode) and a light sensitive device (e.g., a photo diode). An incoming signal causes the light source to illuminate and the light signal generated by the light source in turn causes an electrical signal to be generated by the light sensitive device. Accordingly, the information encoded in the incoming electrical signal is passed through the optocoupler but without a direct electrical connection. The optocoupler prevents damage to downstream circuit components that might otherwise occur in the face of an overcurrent or over-voltage condition on the input signal.

SUMMARY

In one example, a semiconductor device includes an acoustic medium, a first acoustic transducer on the acoustic medium, a first electrode coupled to the first acoustic transducer, a second acoustic transducer on the acoustic medium, and a second electrode coupled to the second acoustic transducer. The semiconductor device also includes a semiconductor substrate to support the acoustic medium and first and second transducers. Mold compound encapsulates at least a portion of the acoustic medium, the first acoustic transducer, the second acoustic transducer, and the semiconductor substrate.

BRIEF DESCRIPTION OF THE DRAWINGS

FIGS. 2-8 illustrate a sequence of processing operations to form an acoustic isolator in accordance with an example.

DETAILED DESCRIPTION

The described examples are directed to an acoustic isolator. The described acoustic isolator includes multiple acoustic transducers on an acoustic medium. The acoustic transducers may include piezoelectric materials. One acoustic transducer vibrates in response to an electrical input signal. The vibrating acoustic transducer causes an acoustic signal to be generated which then propagates through the acoustic medium to another acoustic transducer where the acoustic signal is converted back to an electrical signal. Power can be transferred acoustically through the transducer. Thus, the described acoustic isolator can be used to transfer data signals and/or power.

Figure 1:
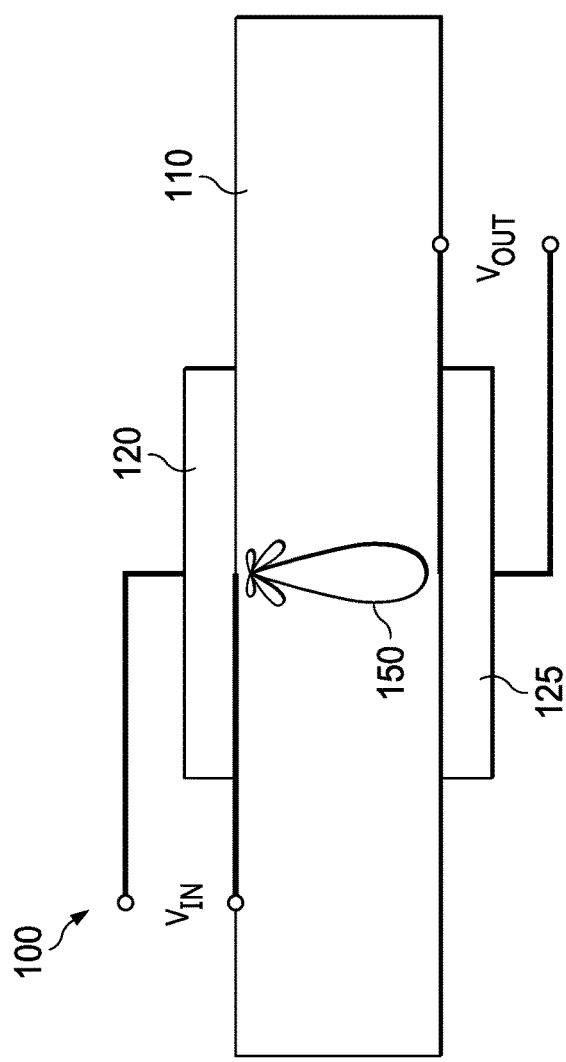
FIG. 1 illustrates an acoustic isolator in accordance with an example.

FIG. 1 shows an acoustic isolator 100 in accordance with an example. The acoustic isolator 100 includes an acoustic medium 110 and acoustic transducers 120 and 125 on the acoustic medium 110. In some embodiments, the acoustic medium 110 includes glass, silicon carbide, sapphire, silicon dioxide, diamond, silicon nitride, and quartz. Each of the acoustic transducers 120, 125 comprises a material that can be made to vibrate based on an electrical signal. In one example, each acoustic transducer 120, 125 includes a ceramic material, quartz, aluminum nitride, lead zirconate titanate, or any suitable type of piezoelectric material. The material comprising acoustic transducer 120 can be the same or different from the material comprising acoustic transducer 125. In some examples, the acoustic impedance of the acoustic medium 110 approximately matches the acoustic impedance of the acoustic transducers 120, 125.

In operation, an input electrical signal, Vin, is provided to electrical contacts connected to acoustic transducer 120. Acoustic signals 150 are generated and propagate through the acoustic medium 110 from the acoustic transducer 120 to the acoustic transducer 125. The acoustic transducer 125 converts the acoustic signal 150 to an output electrical signal, Vout which is accessible via electrical contacts connected to acoustic transducer 120. Electrical isolation is thereby provided by the acoustic isolator 100.

Figure 2:
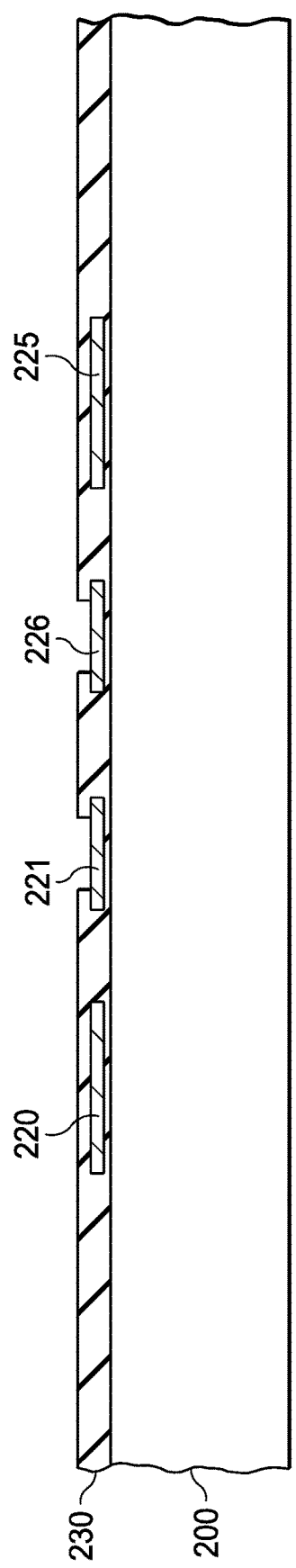

FIGS. 2-8 illustrate the sequence of operations to fabricate the acoustic isolator. FIG. 2 shows a semiconductor substrate (e.g., silicon) 200 on which layer 230 is formed. Layer 230 includes one or more acoustic transducers 220 and 225. An electrical contact 221 provides electrical contact to acoustic transducer 220. Similarly, electrical contact 226 provides electrical contact to acoustic transducer 225. In one example, the processing described herein is performed on a wafer level. Accordingly, multiple acoustic isolators can be performed on a single semiconductor wafer. The semiconductor substrate 200 may comprise a wafer.

Figure 3:
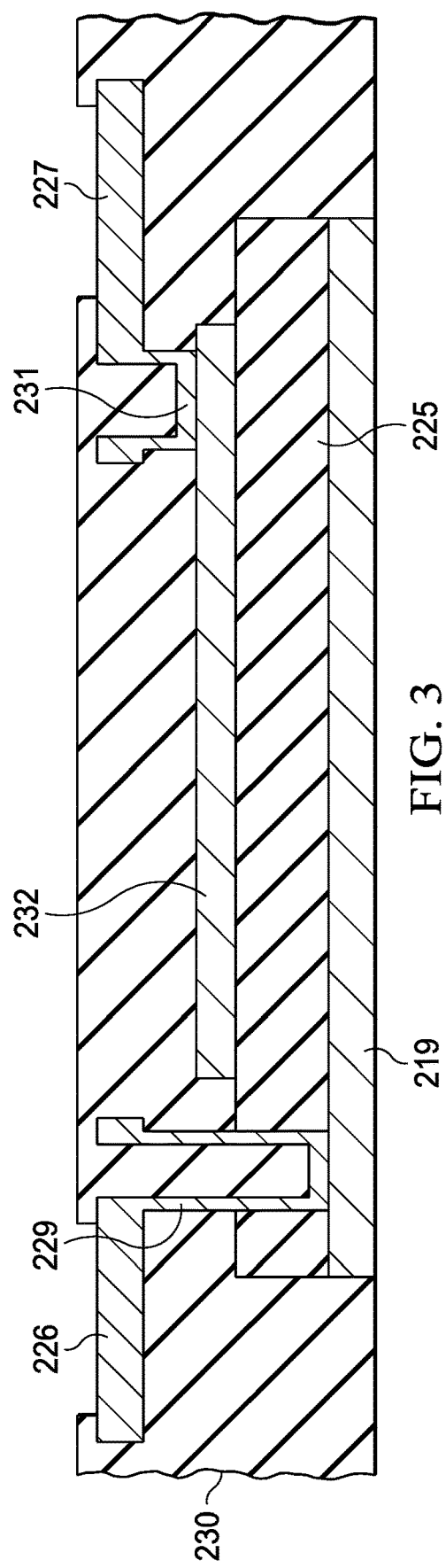

FIG. 3 illustrates a portion of layer 230 including the acoustic transducer 225 and electrical contact 226. A second electrical contact 227 also is shown in FIG. 2 (not in FIG. 1). The acoustic isolator 225 comprises opposing surfaces on which electrodes 230 and 219 are formed. In some examples, electrodes 219, 232 are made from a conductive material (e.g., molybdenum, copper, aluminum, gold, etc.). Layer 230 also comprises silicon dioxide or other suitable dielectric material. Electrode 219 is electrically coupled to electrical contact 226 via interconnect 229. Interconnect 229 comprises aluminum or other suitable conductive material. Similarly, electrode 232 is electrically coupled to electrical contact 227 via interconnect 231, which also may comprise aluminum. Electrical contacts 226 and 227 provide electrical connectivity to the acoustic transducer 225. Openings in layer 230 are formed to provide access to electrical contacts 226 and 227. The other acoustic transducers and their electrodes and electrical contacts are similarly configured.

Figure 4:
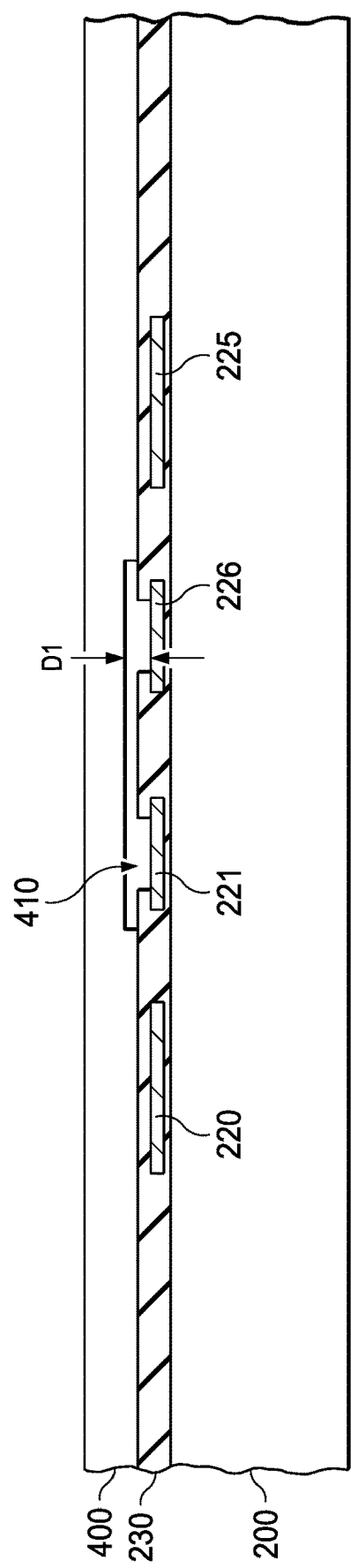

In FIG. 4, another wafer 400 is patterned to include cavities 410 as shown and fusion bonded to layer 230. The wafer 400 may comprise glass in some examples. In some examples, the depth D1 of the cavity 410 is between 10 and 20 micrometers (microns).

Another layer 530 is formed over wafer 400. Layer 530 also includes multiple acoustic transducers 520 and 525 as well as corresponding electrical contacts 521 and 526. The materials and construction of layer 530 can be the same or similar as layer 230. Accordingly, each acoustic transducer 520, 525 includes multiple electrical contacts, although only one contact for each transducer 520, 525 is shown in FIG. 5.

FIG. 6 illustrates that the acoustic medium is removed at 600 is formed to expose the electrical contacts 221 and 226 associated with acoustic transducers 220 and 225. In one example, the opening 600 is formed by tab dicing or etching. Tab dicing is partial dicing, which dices partially through a bonded wafer pair or multi-layer structure to expose the specific areas for different purpose such as sensing or electrical contacts In FIG. 7, the semiconductor substrate 200 on which the structures described herein are formed is singulated into individual die, each die comprising a structure that includes at least one acoustic isolator. FIG. 7 illustrates that a cut is made at 700 to singulate the structure shown into two separate structures 710 and 720. In one example, each of structures 710 and 720 comprises a single acoustic isolator. In other examples, each singulated structure 710 and 720 comprises multiple acoustic isolators. In one particular example, each singulated structure comprises one or more integrated circuits (e.g., a processing core, a phase-lock loop, memory, input/output ports, etc.) as well as one or more acoustic isolators to provide electrical isolation for signals generated by, or to be provided to, the integrated circuit(s).

FIG. 8 shows a singulated structure attached to a leadframe 805 (or laminated substrate). Wirebonds 808 and 813 electrically connect the electrical contacts of the acoustic transducers (e.g., contacts 226 and 526 of acoustic transducers 225 and 525) to contact pads 810 and 815. Mold compound 800 then encapsulates at least a portion of the acoustic medium 400, the acoustic transducers 225 and 525, and the semiconductor substrate 200. In FIG. 8, the mold compound 800 encapsulates all of the components shown in FIG. 8 except for a surface of contact pads 810 and 815 so that external electrical connection can be made to the pads. In some examples, the acoustic isolator described herein can be fabricated as a package which attaches to a circuit board by way of a pair of conductive legs.

Figure 9:
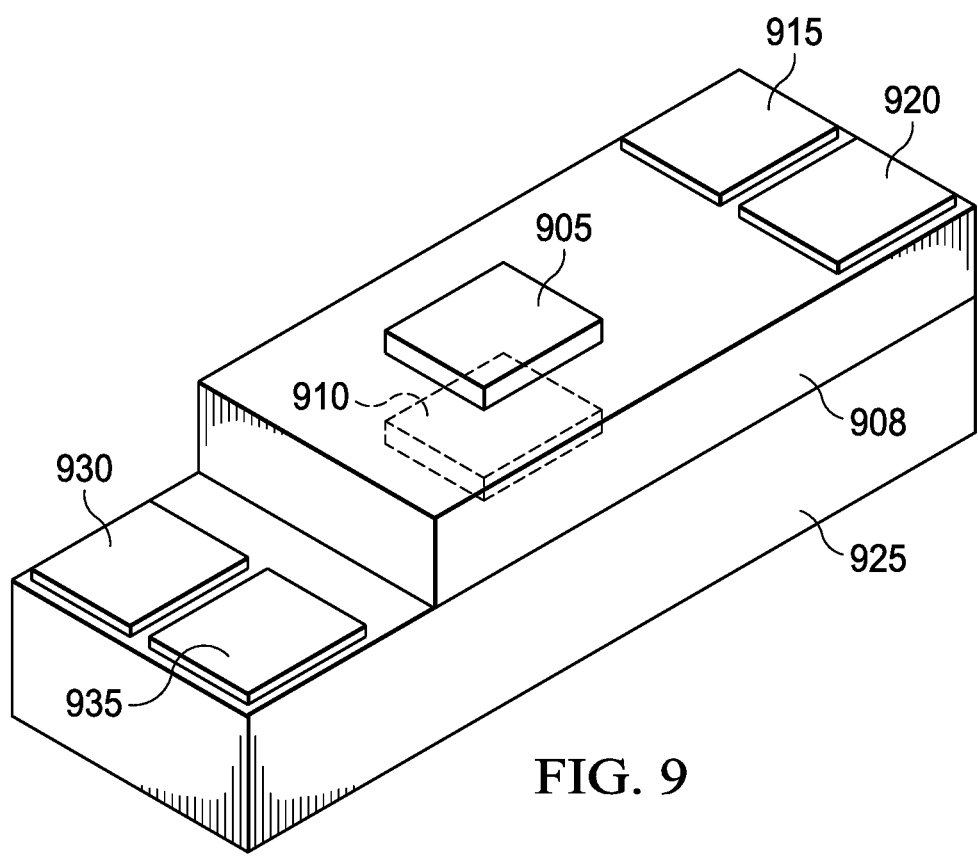
FIG. 9 illustrates an example of an acoustic isolator including acoustic transducers on opposing surfaces of an acoustic medium.

FIG. 9 shows an example (similar that of FIGS. 1-8) in which a pair of acoustic transducers 905, 910 is provided on opposing surfaces of an acoustic medium 908. Electrical contacts 915 and 920 are provided on the acoustic medium 908 as well for connection to acoustic transducer 905. Further, electrical contacts 930 and 935 are provided on the semiconductor substrate 925 for connection to acoustic transducer 910.

Figure 10:
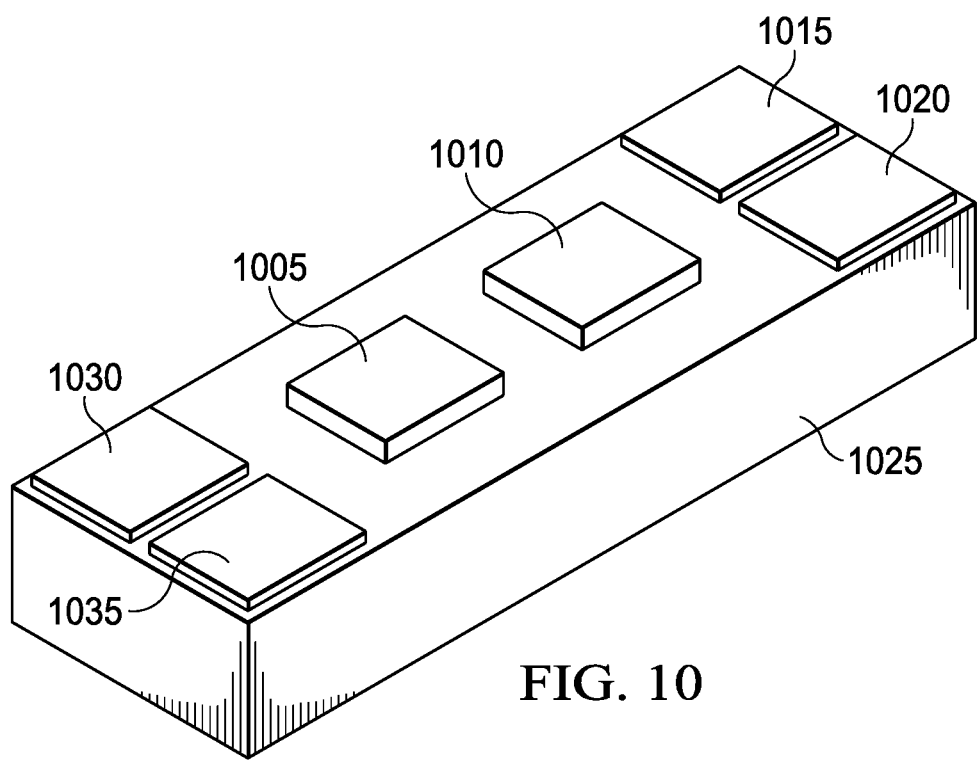
FIG. 10 illustrates an example of an acoustic isolator including acoustic transducers on the same surface of an acoustic medium.

FIG. 10 shows an example in which a pair of acoustic transducers 1005 and 1010 is provided on the same surface of an acoustic medium 1025 (e.g., glass). Electrical contacts 1015 and 1020 are provided on the acoustic medium 1025 for connection to acoustic transducer 1005. Further, electrical contacts 1030 and 1035 are provided on the acoustic medium 1025 for connection to acoustic transducer 1010. In this configuration, the acoustic media allows two acoustic transducers to acoustically couple to each other laterally.

In the examples described herein, the direction of signal flow through the isolator is bidirectional. Accordingly, either transducer can be used to generate the acoustic signal for detection by the other transducer.

In this description, the term "couple" or "couples" means either an indirect or direct wired or wireless connection. Thus, if a first device couples to a second device, that connection may be through a direct connection or through an indirect connection via other devices and connections. The term "approximately" refers to a value that is within plus or minus 10% of another value or range of values.

Modifications are possible in the described embodiments, and other embodiments are possible, within the scope of the claims.

What is claimed is:

1. An apparatus, comprising:
   a lead frame;
   a semiconductor substrate on the lead frame;
   a first layer on the semiconductor substrate, the first layer including a first acoustic transducer and a first electrical contact coupled to the first acoustic transducer;
   an acoustic medium on the first layer, in which a portion of the first layer including the first acoustic transducer is between the acoustic medium and the semiconductor substrate;
   a second layer on the acoustic medium, in which at least part of the acoustic medium is between the first and second layers, and the second layer includes a second acoustic transducer and a second electrical contact coupled to the second acoustic transducer;
   a first contact pad coupled to the first electrical contact;
   a second contact pad coupled to the second electrical contact; and
   a mold compound encapsulating at least a respective part of each the lead frame, the semiconductor substrate, the acoustic medium, the first and second layers, the first and second electrical contacts, and the first and second contact pads.

2. The apparatus of claim 1, wherein the first acoustic transducer is configured to vibrate in response to an electrical signal on the first electrical contact to generate an acoustic signal in the acoustic medium, and wherein the second acoustic transducer is configured to vibrate in response to the acoustic signal in the acoustic medium.

3. The apparatus of claim 1, wherein the acoustic medium includes material selected from the group consisting of glass, silicon carbide, sapphire, silicon dioxide, diamond, silicon nitride, and quartz.

4. The apparatus of claim 1, wherein at least one of the first and second acoustic transducers includes a piezoelectric material.

5. The apparatus of claim 1, wherein each of the first and second acoustic transducers includes piezoelectric material.

6. The apparatus of claim 1, wherein the acoustic medium has an acoustic impedance that approximately matches an acoustic impedance of the first acoustic transducer and an acoustic impedance of the second acoustic transducer.

7. The apparatus of claim 1, further comprising a first bond wire and a second bond wire, wherein the first bond wire is coupled between the first electrical contact and the first contact pad, and the second bond wire is coupled between the second electrical contact and the second contact pad.

8. The apparatus of claim 1, wherein the semiconductor substrate, the acoustic medium, the first and second acoustic transducers, the first and second electrical contacts, and the mold compound are part of an integrated circuit.

9. The apparatus of claim 1, wherein the first layer, the acoustic medium, and the second layer are part of a bidirectional acoustic isolator.

10. The apparatus of claim 1, wherein each of the first and second acoustic transducers includes piezoelectric material.

11. An apparatus, comprising:
    a lead frame;
    a semiconductor substrate on the lead frame;
    a first layer on the semiconductor substrate, the first layer including a first acoustic transducer and a first electrical contact coupled to the first acoustic transducer;

an acoustic medium on the first layer, in which a portion of the first layer including the first acoustic transducer is between the acoustic medium and the semiconductor substrate;

a second layer on the acoustic medium, in which at least a part of the acoustic medium is between the first and second layers, and the second layer includes a second acoustic transducer and a second electrical contact coupled to the second acoustic transducer;

a first contact pad coupled to the first electrical contact; and a second contact pad coupled to the second electrical contact.

12. The apparatus of claim 11, wherein the first acoustic transducer is configured to vibrate in response to an electrical signal on the first electrical contact to generate an acoustic signal in the acoustic medium, and wherein the second acoustic transducer is configured to vibrate in response to the acoustic signal in the acoustic medium.

13. The apparatus of claim 11, wherein the first layer, the acoustic medium, and the second layer are part of a bidirectional acoustic isolator device.

14. The apparatus of claim 11, wherein the acoustic medium has an acoustic impedance that approximately matches an acoustic impedance of the first acoustic transducer and an acoustic impedance of the second acoustic transducer.

15. The apparatus of claim 11, further comprising a mold compound encapsulating at least a respective part of each the lead frame, the semiconductor substrate, the acoustic medium, the first and second layers, the first and second electrical contacts, and the first and second contact pads.

16. The apparatus of claim 11, wherein the acoustic medium includes material selected from the group consisting of glass, silicon carbide, sapphire, silicon dioxide, diamond, silicon nitride, and quartz.

17. The apparatus of claim 11, wherein at least one of the first and second acoustic transducers includes a piezoelectric material.

* * * * *